US006973225B2

(12) United States Patent
Nguyen et al.

(10) Patent No.: US 6,973,225 B2
(45) Date of Patent: Dec. 6, 2005

(54) TECHNIQUES FOR ATTACHING ROTATED PHOTONIC DEVICES TO AN OPTICAL SUB-ASSEMBLY IN AN OPTOELECTRONIC PACKAGE

(75) Inventors: Luu Thanh Nguyen, Sunnyvale, CA (US); Ken Pham, San Jose, CA (US); Peter Deane, Los Altos, CA (US); William Paul Mazotti, San Martin, CA (US); Bruce Carlton Roberts, San Jose, CA (US); Hau Thanh Nguyen, San Jose, CA (US); John P. Briant, Cambridge (GB); Roger Clarke, Cambridge (GB); Michael R. Nelson, Cambridge (GB); Janet E. Townsend, Fulbourn (GB)

(73) Assignee: National Semiconductor Corporation, Santa Clara, CA (US)

( * ) Notice: Subject to any disclaimer, the term of this patent is extended or adjusted under 35 U.S.C. 154(b) by 366 days.

(21) Appl. No.: 10/165,548

(22) Filed: Jun. 6, 2002

(65) Prior Publication Data

US 2003/0057535 A1 Mar. 27, 2003

Related U.S. Application Data

(60) Provisional application No. 60/331,337, filed on Sep. 24, 2001.

(51) Int. Cl.[7] ................................................ G02B 6/12
(52) U.S. Cl. ........................... 385/14; 385/92; 385/94; 257/684
(58) Field of Search ............................... 385/14, 49, 53, 385/59, 88–94, 129–131; 257/676–678, 684–688, 691, 690, 717, 723, 731, 737, 777–780; 438/22, 26, 27, 29, 31, 48, 122, 123, 106; 174/52.2, 52.4; 361/760, 753, 813

(56) References Cited

U.S. PATENT DOCUMENTS

| 4,152,711 A | * | 5/1979 | Nakata .......................... 257/79 |
| 5,011,246 A | | 4/1991 | Corradetti et al. ............. 385/92 |
| 5,019,673 A | | 5/1991 | Juskey et al. ............... 174/52.2 |

(Continued)

FOREIGN PATENT DOCUMENTS

| JP | 60-202956 | 10/1985 |
| JP | 08125066 | 5/1996 |

OTHER PUBLICATIONS

S. Savastiouk, PH.D., et al. "3–D stacked wafer–level packaging", Mar. 2000, *Advanced Packaging*, pp. 28–34.

National Semiconductor, "Packaging Databook", *1993 National Semiconductor*, pp. v–xi to 1–3 to 1–4, 3–1 to 3–20, 3–30 to 3–31, 3–62 to 3–69. *Please note: The year of publication is sufficiently earlier than the effective U.S. filing date so that the particular month of publication is not in issue.*

Primary Examiner—Diane I. Lee
Assistant Examiner—Kumiko C. Koyama
(74) Attorney, Agent, or Firm—Beyer Weaver & Thomas LLP (57) ABSTRACT

The techniques of the present invention are directed towards setting a photonic device into a groove of a substrate, which is then attached to the chip sub-assembly in a way that the resulting optoelectronic package has a low profile and the interconnects between the photonic device and the semiconductor chip are short. The technique involves partially etching a groove in a substrate to allow for positioning of a photonic device within the groove. The photonic device is connected to the chip sub-assembly through interconnects that extend through the thickness of the substrate. The photonic devices are placed on their sides so that the active facets are perpendicular to the main axis of the chip sub-assembly. In this configuration, the optical fibers can be positioned parallel to the CSA top surface, ensuring a low module profile in the process.

19 Claims, 8 Drawing Sheets

U.S. PATENT DOCUMENTS

| | | | | |
|---|---|---|---|---|
| 5,054,870 A | * | 10/1991 | Losch et al. | 385/14 |
| 5,139,969 A | | 8/1992 | Mori | 438/123 |
| 5,208,879 A | * | 5/1993 | Gallo et al. | 385/14 |
| 5,325,455 A | | 6/1994 | Henson et al. | 385/89 |
| 5,349,317 A | * | 9/1994 | Notani et al. | 333/236 |
| 5,352,926 A | | 10/1994 | Andrews | 257/717 |
| 5,487,124 A | | 1/1996 | Bowen et al. | 385/93 |
| 5,515,467 A | | 5/1996 | Webb | 385/88 |
| 5,521,992 A | * | 5/1996 | Chun et al. | 385/14 |
| 5,579,208 A | | 11/1996 | Honda et al. | 361/813 |
| 5,590,232 A | | 12/1996 | Wentworth et al. | 385/92 |
| 5,608,262 A | | 3/1997 | Degani et al. | 257/723 |
| 5,621,837 A | | 4/1997 | Yamada et al. | 385/88 |
| 5,723,369 A | | 3/1998 | Barber | 438/106 |
| 5,726,079 A | | 3/1998 | Johnson | 438/106 |
| 5,744,827 A | | 4/1998 | Jeong et al. | 257/686 |
| 5,774,616 A | * | 6/1998 | Matsuda | 385/89 |
| 5,780,875 A | * | 7/1998 | Tsuji et al. | 257/81 |
| 5,790,384 A | | 8/1998 | Ahmad et al. | 361/760 |
| 5,798,567 A | | 8/1998 | Kelly et al. | 257/723 |
| 5,821,615 A | | 10/1998 | Lee | 257/686 |
| 5,864,642 A | * | 1/1999 | Chun et al. | 385/14 |
| 5,896,479 A | | 4/1999 | Vladic | 385/59 |
| 5,933,558 A | | 8/1999 | Sauvageau et al. | 385/88 |
| 5,949,135 A | | 9/1999 | Washida et al. | 257/685 |
| 6,027,254 A | * | 2/2000 | Yamada et al. | 385/88 |
| 6,043,430 A | | 3/2000 | Chun | 174/52.4 |
| 6,054,759 A | | 4/2000 | Nakamura | 257/691 |
| 6,075,284 A | | 6/2000 | Choi et al. | 257/676 |
| 6,086,263 A | | 7/2000 | Selli et al. | 385/88 |
| 6,201,704 B1 | | 3/2001 | Poplawski et al. | 361/753 |
| 6,236,109 B1 | | 5/2001 | Hsuan et al. | 257/688 |
| 6,239,427 B1 | | 5/2001 | Mizue | 250/239 |
| 6,258,630 B1 | | 7/2001 | Kawahara | 438/122 |
| 6,281,568 B1 | | 8/2001 | Glenn et al. | 257/684 |
| 6,305,848 B1 | | 10/2001 | Gregory | 385/53 |
| 6,316,837 B1 | | 11/2001 | Song | 257/778 |
| 6,316,838 B1 | | 11/2001 | Ozawa et al. | 257/778 |
| 6,318,902 B1 | | 11/2001 | Igl et al. | 385/59 |
| 6,318,909 B1 | | 11/2001 | Giboney et al. | 385/90 |
| 6,356,686 B1 | | 3/2002 | Kuczynski | 385/39 |
| 6,364,542 B1 | | 4/2002 | Deane et al. | 385/92 |
| 6,450,704 B1 | | 9/2002 | O'Connor et al. | 385/92 |
| 6,595,699 B1 | * | 7/2003 | Nguyen et al. | 385/88 |
| 6,624,507 B1 | | 9/2003 | Nguyen et al. | 257/686 |
| 6,635,866 B2 | | 10/2003 | Chan et al. | 250/239 |
| 6,655,854 B1 | * | 12/2003 | Nguyen et al. | 385/88 |
| 2001/0013645 A1 | | 8/2001 | King et al. | 257/678 |
| 2001/0048151 A1 | | 12/2001 | Chun | 257/686 |

\* cited by examiner

TECHNIQUES FOR ATTACHING ROTATED PHOTONIC DEVICES TO AN OPTICAL SUB-ASSEMBLY IN AN OPTOELECTRONIC PACKAGE

CROSS-REFERENCE TO RELATED APPLICATIONS

This application claims priority of U.S. provisional patent application No. 60/331,337, filed Sep. 24, 2001, entitled "TECHNIQUES FOR ATTACHING ROTATED PHOTONIC DEVICES TO AN OPTICAL SUB-ASSEMBLY IN AN OPTOELECTRONIC PACKAGE," which is hereby incorporated by reference.

This application is related to U.S. patent application Ser. No. 09/568,094, entitled "DEVICE AND METHOD FOR PROVIDING A TRUE SEMICONDUCTOR DIE TO EXTERNAL FIBER OPTIC CABLE CONNECTION," filed on May 9, 2000, to U.S. patent application Ser. No. 09/568,558, entitled "ARRAYABLE, SCALABLE AND STACKABLE MOLDED PACKAGE CONFIGURATION," filed on May 9, 2000, to U.S. patent application Ser. No. 09/713,367, entitled "MINIATURE OPTO-ELECTRIC TRANSCEIVER," filed on Nov. 14, 2000, to U.S. patent application Ser. No. 09/922,358, entitled "MINIATURE SEMICONDUCTOR PACKAGE FOR OPTOELECTRONIC DEVICES," filed on Aug. 3, 2001, to U.S. patent application Ser. No. 09/922,598, entitled "TECHNIQUES FOR JOINING AN OPTOELECTRONIC MODULE TO A SEMICONDUCTOR PACKAGE," filed on Aug. 3, 2001, to U.S. patent application Ser. No. 09/922,601, entitled "OPTICAL SUB-ASSEMBLY FOR OPTO-ELECTRONIC MODULES," filed on Aug. 3, 2001, to U.S. patent application No. Ser. 10/165,553 entitled "OPTICAL SUB-ASSEMBLY FOR OPTO-ELECTRONIC MODULES," filed concurrently herewith, and to U.S. patent application Ser. No. 10/165,711 entitled "CERAMIC OPTICAL SUB-ASSEMBLY FOR OPTO-ELECTRONIC MODULES," filed concurrently herewith, the content of each of which are hereby incorporated by reference.

FIELD OF THE INVENTION

The present invention relates generally to optoelectronic device packages, and more specifically to attaching a rotated photonic device onto a chip sub-assembly.

BACKGROUND OF THE INVENTION

Most computer and communication networks today rely on copper wiring to transmit data between nodes in the network. Since the data transmitted over the copper wire and the data processed within the nodes are both represented in the form of electrical signals, the transfer of data at the node-copper wire interface is straight forward. Other than perhaps a level shift and signal amplification, no other signal processing is required for data transmitted over the copper wire to be decoded by the node. The drawback with using copper wire is its relatively low bandwidth. Copper's ability to transmit data is significantly limited compared to other media, such as fiber optics. Accordingly much of the computer and communication networks being built today, including the Internet, are using fiber optic cabling instead of copper wire.

With fiber optic cabling, data is transmitted using light signals, not electrical signals. For example, a logical one may be represented by a light pulse of a specific duration and a logical zero may be represented by the absence of a light pulse for the same duration. In addition, it is also possible to transmit at the same time multiple colors of light over a single strand of optic fiber, with each color of light representing a distinct data stream. Since light is attenuated less in fiber than electrons traveling through copper, and multiple data streams can be transmitted at one time, the bandwidth of optic fiber is significantly greater than copper.

While fiber optic cabling is very efficient for transferring data, the use of light signals to process data is still very difficult. Data is typically transferred and stored in various locations before, during and after it is operated on in a computer. There still is no efficient way to "store" light signals representative of data. Networks will therefore likely continue using fiber optics for transmitting data between nodes and silicon chips to process the data within the nodes for the foreseeable future. The interface between the fiber optic cable and the nodes that process the data is therefore problematic because signals need to be converted between the electrical and the light domains.

Fiber optic transceivers, which convert light signals from a fiber optic cable into electrical signals, and vice versa, are used as the interface between a fiber optic line and a computer node. A typical transceiver includes a substrate, one or more semiconductor devices mounted on the substrate, one or more discrete optical detectors for converting light. Signals received over fiber optic cables into electrical signals, one or more discrete optical emitters for converting electrical signals from the semiconductor devices into light signals. A number of fiber optic transceivers are commercially available from Hewlett Packard, AMP, Sumitomo, Nortel, and Siemens. The problem with all of these fiber optic transceivers is that they are expensive and difficult to fabricate. With each transceiver, the semiconductor devices, emitters, and optical detectors have to be individually mounted onto the substrate, which is a costly and time-consuming process. This limits the applications in which optical interconnects could be substituted for traditional copper usage. Furthermore, the use of discrete emitters and optical detectors adversely affects the performance of the transceiver because electrical parasitics between discrete components are sources of electrical attenuation of inter-chip signals at Gigabit per second speeds that are generally used with such transceivers. To compensate for the electrical parasitics, more power is required to drive these traces than would be needed for an integrated device. Additionally, the form factor of the on-board optical transceiver is relatively large and therefore does not facilitate, for example, inter-board and chip-to-chip optical interconnect-ability. For instance, some optoelectronic packages and their attachment configurations require optical fibers to bend in order to be connected to the active facets of the optical device. Unfortunately, optical fibers can only bend with relatively large radii, thereby causing the optoelectronic packages to occupy large amounts of space. Also, other optoelectronic packages, for example, Transistor Outline metal cans or ceramic cavity packages, use optical lenses to focus light signals. Unfortunately, these optical lenses increase the size requirements and the complexity of the packages.

A low cost semiconductor device that has a small form factor and that provides a true die to external fiber optic connection is therefore needed.

BRIEF SUMMARY OF THE INVENTION

The present invention is directed to a technique for attaching photonic devices onto a semiconductor chip sub-assembly such that the optical fibers positioned near the active facets of the photonic devices are parallel to the top surface of the chip sub-assembly. The technique involves setting a photonic device into a groove of a substrate, which is then attached to the chip sub-assembly in a way that the resulting optoelectronic package has a low profile and the interconnects between the photonic device and the semiconductor chip are short.

One aspect of the present invention pertains to an optoelectronic module having a substrate, a photonic device and a chip sub-assembly. The substrate has a recessed region formed in the top surface of the substrate and electrical pathways that extend from the perimeter of the recessed region to the bottom surface of the substrate. The photonic device has active facets and anode pads on a first surface and a cathode surface on an opposing second surface, the anode pads and the cathode surface being in contact with the electrical pathways on the top surface of the substrate. The photonic device is situated within the recessed region of the substrate such that the active facets and anode pads are in a plane that is substantially perpendicular to the top surface of the substrate. The chip sub-assembly has an embedded semiconductor die and up-linking contacts that are in electrical communication with the semiconductor die and portions of the electrical pathways on the bottom surface of the substrate.

Another aspect of the present invention pertains to a method of forming a component for use in an optoelectronic package. This method involves placing a photonic device in a groove of a flexible substrate such that the surface of an active facet of the photonic device lies in a plane that is perpendicular to a top surface of the flexible substrate. Then an anode and a cathode of the photonic device is connected to metal contact pads of the flexible substrate, the metal contact pads being connected to electrical pathways that extend from the top surface to the bottom surface of the flexible substrate. Then a bottom surface of the flexible substrate is placed onto a top surface of a chip sub-assembly such that the electrical pathways of the flexible substrate are connected to up-linking contacts of the chip sub-assembly.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

An overview of the invention will first be provided. The technique of the present invention involves partially etching a groove in a substrate to allow for positioning of a photonic device (e.g., lasers or detectors) within the groove. Connections from the contact pads of the photonics to the pads on the substrate are made by adhesives such as solder or conductive glue. The substrate pads are connected by through vias to the exposed solder bumps of the chip sub-assembly (CSA). The substrate with the photonics is then bonded to the CSA by a number of techniques such as solder, anisotropic conductive adhesive, or wirebond stud with epoxy. The photonic devices are placed on their sides so that the active facets are perpendicular to the main axis of the CSA package. In other words, the photonic device is rotated such that the surface of the active facets of the photonic device is in a plane that is perpendicular to the top surface of the (CSA). In this configuration, the optical fibers can be positioned parallel to the CSA top surface, ensuring a low module profile in the process. The invention applies to transduction modules such as optoelectronic packages that can serve as transceivers, transmitters, or receivers. More generally stated, the concepts of the present invention can be used to conveniently arrange devices for the transduction of signals to and from voltage and current domains to infrared radiation domains.

Figure 1A:
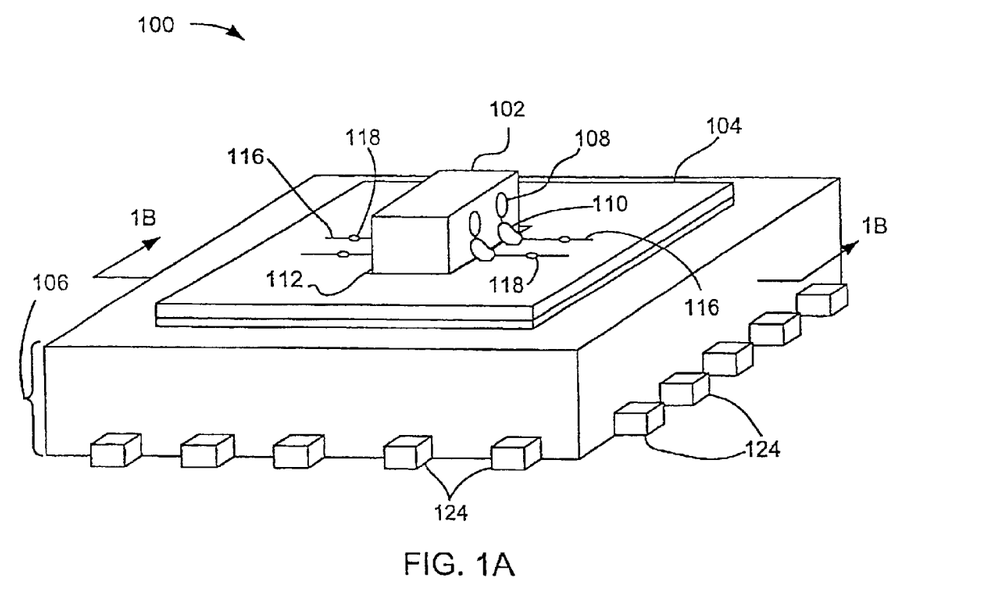
FIG. 1A illustrates a perspective view of an optoelectronic module according to one embodiment of the present invention.
Figure 1B:
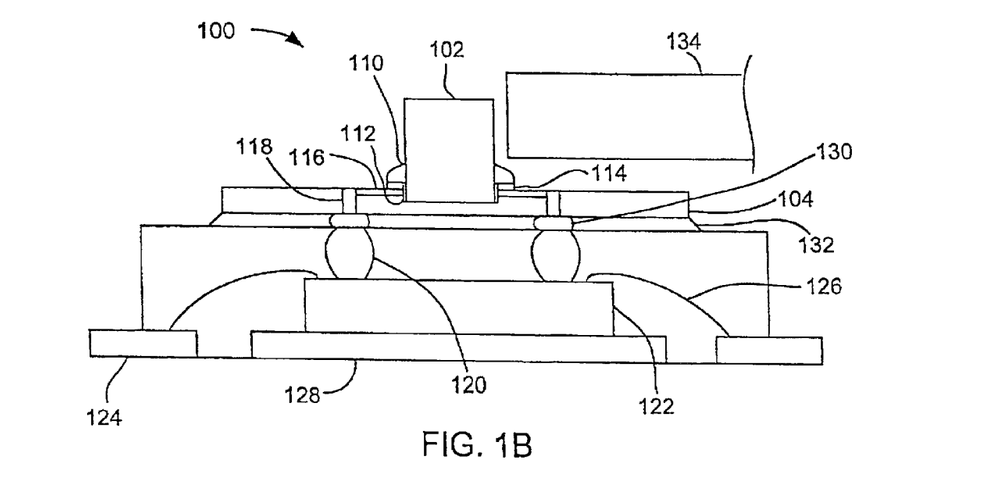
FIG. 1B illustrates a side plan, cross-sectional view of the optoelectronic module along line 1B–1B.

The overall concept of the present invention will now be presented through FIGS. 1A and 1B. FIG. 1A illustrates a perspective view of an optoelectronic module 100 according to one embodiment of the present invention. FIG. 1B illustrates a side plan, cross-sectional view of the optoelectronic module 100 along line 1B—1B. The optoelectronic module 100 includes a photonic device 102 that is set within a substrate 104, which is in turn, attached to a chip sub-assembly 106.

The photonic device 102 is a die cut from a semiconductor material wafer made of material such as gallium arsenide. The photonic device 102 contains either light emitters, such as a laser, or a light detector. The active facets 108 on the side surface of the photonic device 102 are the surfaces that actually either emit light or detect light. The photonic device 102 happens to have two active facets 108 and therefore, either two detectors or two emitters. In alternative embodiments, however, the photonic device 102 can have one or more than two active facets 108. By setting a photonic device 102 containing light emitters within the optoelectronic module 100, the module 100 can operate as a transmitter. On the other hand, when the photonic device 102 contains light detectors, the optoelectronic module 100 can operate as a receiver. In alternative embodiments, the module 100 can include two separate photonic devices 102, one having emitters and one having detectors, thus allowing the module 100 to operate as a transceiver. In such a configuration, the substrate can have more than one groove wherein each groove is sized to receive each one of the photonic devices. On the other hand, the substrate could have a single groove that is long enough to receive multiple photonic devices.

The photonic device 102 has an anode electrical contact surface for each of the emitters or detectors within the photonic device 102. In the specific photonic device 102 illustrated in FIG. 1A, the anodes are located next to the active facets 108. In FIG. 1A, the anode contact surfaces are covered by the adhesive conductive material 110. The emitters or detectors share a common cathode that is the surface of the photonic device 102 opposite the surface containing the active facets 108. Various transduction devices can be used in place of the photonic devices. For instance, other types of suitable transduction devices can contain components such as, but not limited to, windows, lenses, prisms, and gratings.

The substrate 104 is a sheet of flexible material in which the top surface of the substrate 104 contains a groove 112 that is sized to receive the photonic device 102. Contact pads 114 are located at the edges of the groove 112. Connected to the contact pads 114 are electrical traces 116 that are embedded into the top surface of the substrate 104. In alternative embodiments, traces 116 can be formed on the surface of substrate 104, rather than being embedded within substrate 104. Each of the electronic traces 116 connect to vias 118, which extend through the thickness of the substrate 104. The pathway extending through the contact pads 114, the traces 116, and the vias 118 form the electrical pathway through the substrate that allows the photonic device 102 to form the required connection with the chip sub-assembly 106. Traces 116 are formed of conductive materials that can be metal or non-metal. Circuitry set can be formed through various methods including metal deposition processes and pre-forming the traces and pads.

The substrate 104 is ideally made of polyimide due to its thermal stability and ability to be etched in a number of manners (e.g., wet etching, plasma etching, or laser etching). However, ceramic substrates can also be used since ceramic parts can be either molded or sintered with relatively high accuracy. Trace metalization on the ceramic substrates is performed currently in standard ceramic packages, which are available commercially.

The interface between the photonic device 102 and substrate 104 is at the groove 112 where the photonic device 102 is placed within the groove 112. The anodes and the cathode of photonic device 102 are connected to contact pads 114 through conductive adhesive materials 110. As will be described below, the adhesive materials 110 can be either solder material or a combination of a wire bond stud and epoxy. Another technique of connecting the anodes and cathodes of photonic device 102 to contact pads 114 is via wirebonding techniques that are modified to connect contact surfaces that are in different planes of orientation.

As illustrated, the chip sub-assembly (CSA) 106 is a leadless leadframe semiconductor chip package having electrical up-links 120 that provide the semiconductor die 122 with electrical contact surfaces on the top surface of the CSA 106. The contact surfaces on the top surface of the CSA 106 allow the die 122 to be ultimately connected to the photonic device 102, through the substrate 104. Within CSA 106, the die 122 is connected to contact leads 124 through interconnecting wires 126. The contact leads 124 allow the CSA 106, and therefore the optoelectronic module 100, to be connected to an electronic substrate such as a printed circuit board. The die 122 is supported on top of a die attach pad 128. The Leadless Leadframe Package used in the CSA 106 has the following benefits: small factor, low profile (could be as thin as 0.5 mm), and excellent thermal dissipation. In alternative embodiments of the present invention, CSA 106 can be replaced with a different semiconductor chip package form factor having electrical up-links that allow for connection to the photonic device 102 through the substrate 104. CSA 102 can also be any type of driver device, such as multi-chip assemblies, as well as conventional driver boards.

The connection between CSA 106 and substrate 104 is facilitated by solder balls 130 that provide the pathway between up-links 120 of the CSA 106 and the vias 118 of the substrate 104. The space between the substrate 104 and the top surface of the CSA 106 is filled in with underfill material 132, which is, for example, epoxy material. The underfill material serves to strengthen the bond between the substrate 104 and the CSA 106 and also facilitates heat transfer between the two components. For further description concerning methods for attaching the substrate 104 to the CSA 105, please refer to U.S. Pat. No. 6,642,613, entitled "TECHNIQUES FOR JOINING AN OPTOELECTRONIC MODULE TO A SEMICONDUCTOR PACKAGE."

Also illustrated in FIG. 1B, is an optical fiber 134 that is placed close to the active facet of the photonic device 102.

The technique of connecting the photonic device 102 to the CSA 106 through the substrate 104 provides a low profile contact, which can be kept smaller than 50 um. This allows the optical fiber, or fiber array, to be positioned very close to the active facets of the photonic devices, enhancing the optical coupling efficiency. A thin optoelectronic module provides the option of higher board packing density within a given enclosure volume. The configuration as shown in FIGS. 1A and 1B also minimizes the electrical pathway between the photonic device 102 and the semiconductor die 122. By minimizing this electrical pathway, the electrical parasitics accompanying the optoelectronic module 100 are also minimized. The substrate can be as thin as 50 um so that the typical trace length from the substrate pad, through the via, through the optical sub-assembly/chip sub-assembly interface, through the solder ball, to finally the silicon driver die can be kept to about 300 um.

The optical coupling of fiber 134 to photonic device 102 is accomplished without the use of lenses. The configuration provides close proximity of fiber to device, reducing the need for active alignment. Active alignment slows down the manufacturing process and adds costs. In alternative embodiments, however, lenses can be used for advantageous purposes. For instance, a lensed fiber could be utilized.

Figure 2:
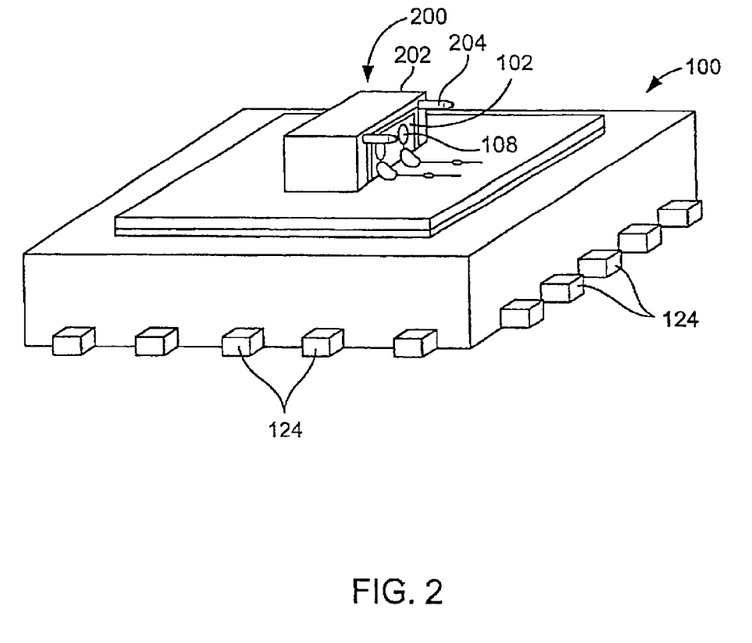
FIG. 2 illustrates a perspective view of optoelectronic module with a mounting fixture attached over top of photonic device, according to one embodiment of the present invention.

FIG. 2 illustrates a perspective view of optoelectronic module 100 with a mounting fixture 200 attached to the photonic device 102, according to one embodiment of the present invention. Mounting fixture 200 is made up of a housing block 202 and alignment pins 204. The housing block 202 supports the alignment pins 204 such that the pins extend in front of the photonic device 102. The housing block can be formed of materials such as polyetheretherketone (PEEK) or liquid crystal polymer (LCP). Such materials are available at different loadings of glass fillers and fibers to provide high thermal stability. The right range of filler loading should be selected to provide good dimensional stability, while maintaining a certain degree of moldability. For the LCP material, for instance, 30 to 40% (by weight) was found to be the proper range. The pins 204 are typically made out of stainless steel. The alignment pins 204 guide the attachment of a ferrule (not shown) that secures the optical fibers so that the optical fibers can be properly aligned with the active facets 108 of the photonic device 102. The pins can take on various shapes and forms in alternative embodiments. For instance, the pins can be integrally formed from the material of housing block 202.

Figure 3A:
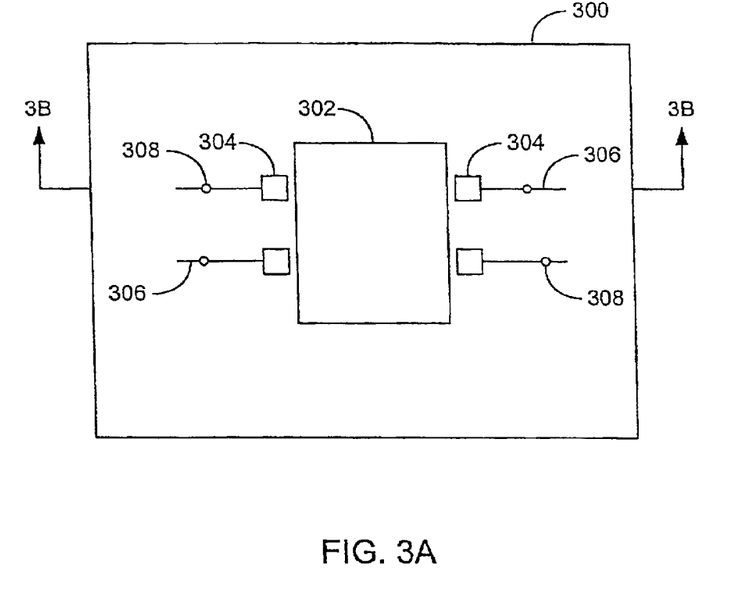
FIG. 3A illustrates a top plan view of a substrate containing a groove according to one embodiment of the present invention.
Figure 3B:
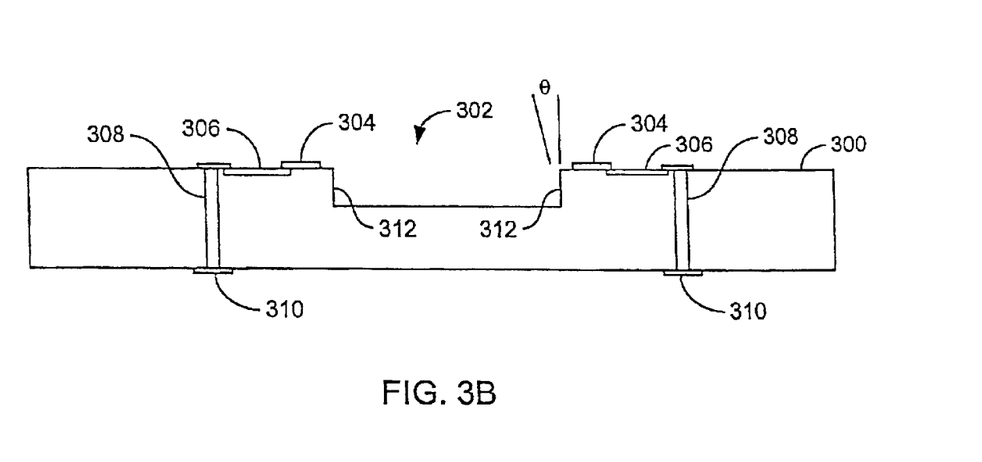
FIG. 3B illustrates a side plan cross-sectional view of substrate along line 3B-3B.

FIGS. 3A and 3B will now be presented to better illustrate and describe the substrate 104. FIG. 3A illustrates a top plan view of a substrate 300 containing a groove 302 according to one embodiment of the present invention. Groove 302 is a recessed region formed within substrate 300. FIG. 3B illustrates a side plan cross-sectional view of substrate 300 along line 3B—3B. As seen in FIG. 3A, substrate 300 includes contact pads 304 along the edges of the groove 302. The contact pads 304 provide the areas for electrical contact with a photonic device to be placed within the groove 302. In one embodiment, the pads 304 are formed of copper and may have a nickel/gold outer layer. Other substrate metal finishes can also be used such as OSP (Organic Solderability Preservative) or pre-tinned contacts. Electrical traces 306 extend from contact pads 304. Electrical traces 306 are embedded within the surface of the substrate 300 and make contact with vias 308. Each of the vias 308 extend through the thickness of the substrate 300 so that an electrical pathway extends from the top to the bottom surface of the substrate 300. The vias 308 are filled with a conductive material that allow for the electrical pathway to run through the vias 308.

As can be seen in FIG. 3B, at the bottom surface of the substrate 300, a metal pad 310 is typically placed at the end of via 308. The metal pad 310 provides a contact surface so that a firm connection can be made between the substrate 300 and a CSA, to which the substrate 300 will be attached. The vertical walls 312 of the groove 302 are preferably extended vertically with respect to the top surface of the substrate 300. However, the vertical walls can have an angle theta in the range of +2 to −5°. The angle theta may result from the laser ablation method of forming the groove 302. Other methods, such as etching, can also be used to form the groove 302.

The depth of the groove must be deep enough such that the surface tensions of the adhesive materials (i.e., solder or conductive epoxy) do not tip the photonic devices over the side walls of the groove during process operations. Such tipping can occur if the surface tension exerts enough force upon the photonic devices to either push or pull the photonic device over the side walls 312 of the groove 302. On the other hand, the groove cannot be too deep because the thickness of the substrate in the region of the groove would be too shallow and therefore reduce the structural integrity of the substrate.

It is desirable to minimize the distance between the anode of the photonic device and the metal pad 304 of the substrate in order to minimize the electrical path length of the optoelectronic module. In the same spirit, it is desirable to minimize the length of the electrical traces 306 and the height of the vias 308.

Figure 4A:
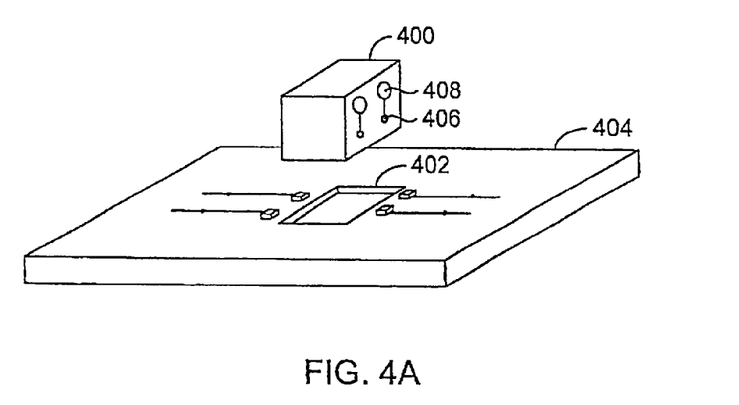
FIG. 4A illustrates a photonic device that is to be placed into a groove of substrate.

The techniques for connecting a photonic device to a substrate will now be described. Two methods of interconnection include a first method of using eutectic solder and a second method of using a wirebond stud with conductive epoxy. First, the method of using eutectic solder will be described. FIG. 4A illustrates a photonic device 400 that is to be placed into a groove 402 of substrate 404. The anode 406 of the active facet 408 is located on the side surface of the photonic device 400.

Figure 4B:
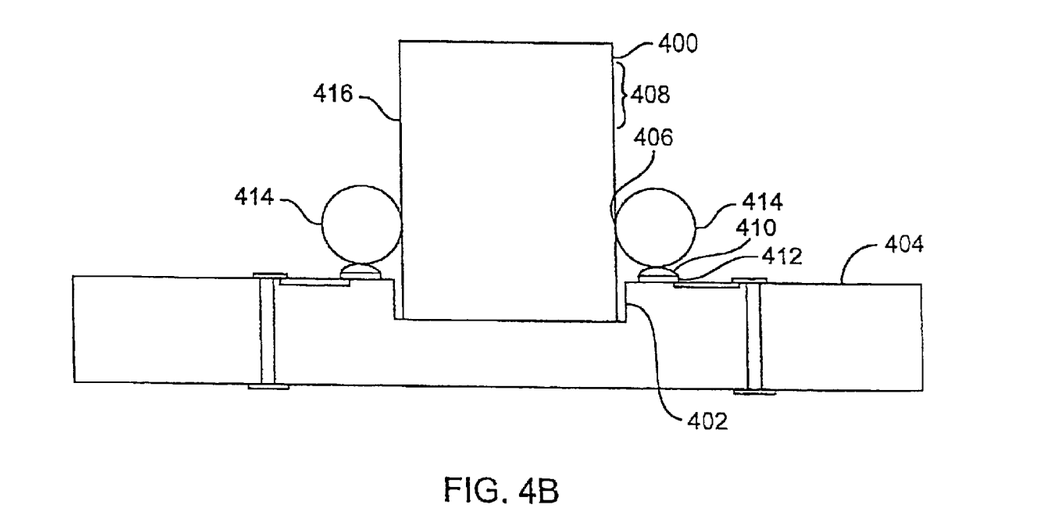
FIG. 4B illustrates a side plan, cross-sectional view of the photonic device after it is placed into the groove of substrate.

FIG. 4B illustrates a side plan, cross-sectional view of the photonic device 400 after it is placed into the groove 402 of substrate 404. Solder paste 410 is applied to the surface of the contact pad 412. Solder paste 410 is printed on the metal pads 412 (front and back) on the substrate side using standard paste printing techniques. The device 400 is picked and placed within the half-etched groove 402 so that the solder bumps on the device 400 make contact with the paste 410 printed on the metal pads 412.

Solder 414 is then applied to the solder paste 410 such that the solder 414 also makes contact with the anode 406 and the cathode 416. Solder balls can be dropped on the pads on the back for contact with the back of the device (common cathode). Once the package is reflowed, the paste 410 will melt and combine with each solder bump 414 to form one solder joint. As mentioned earlier, the cathode 416 is actually the surface of the photonic device 400 opposite the surface containing the active facet 408 and the anode 406. The photonic device 400 needs to have solder bumps prior to pick and place. Solder bumps on the device 400 can be generated via a number of standard commercially available processes such as solder electrolytic plating, electroless plating followed by printing of solder paste, or stencil printing of solder paste of the entire wafer, followed by reflowing.

Figure 4C:
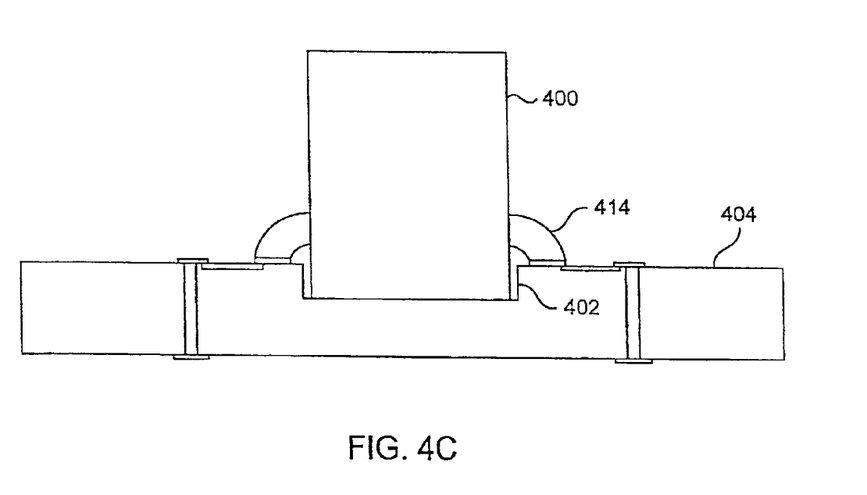
FIG. 4C illustrates a side plan, cross-sectional view of the photonic device set within the substrate after the solder has been reflowed.

To secure the connection between the photonic device 400 and the substrate 404, the solder 414 is reflowed by a heating process. FIG. 4C illustrates a side plan, cross-sectional view of the photonic device 400 set within the substrate 404 after the solder 414 has been reflowed. The surface tension of the solder material 414 causes the solder 414 to regroup into a new shape as shown. The surface tension of the solder 414 also causes the solder 414 to move the photonic device 400 within the groove 402, which is sized slightly larger than the photonic device 400. The movement of the photonic device 400 within the groove 402 actually is beneficial in that the solder 414 causes self-alignment of the photonic device 400 within the groove 402. Self-alignment of the photonic die 400 is achieved with the solder and thereby provides for better part accuracy, performance, and reliability. With the solder interconnect approach, self-alignment can be achieved with the device pads off-center by as much as half a pad size (50 um). With the wirebond stud and conductive epoxy approach, surface tension forces are weaker. In the wirebond stud case, the pick and place accuracy of the devices and the design and manufacturing of the groove need to be matched closely.

There are three critical factors when using solder to interconnect a photonic device. The first is the volume of the solder. The solder bump dimensions on the photonic device need to be carefully selected in conjunction with the volume of solder paste printed on the board so that the proper volume is used for the optimal surface tension forces. The dimensions of the solder bump on the photonic device directly affect the bonding of the solder to the photonic device and the metal pads of the substrate.

Secondly, the dimensions of the pads on both the photonic device and the substrate are critical to the proper self-aligning actions of the solder during reflow processes. The pads of the photonic devices refers to the anode contact surface, while the pad surface of the substrate refers to the metal pads. The dimensions on both the die side and the substrate side are crucial to ensure that the device will self-align in the right direction. For the application, surface tension modeling has suggested that the die pad (anode) diameter be smaller than the substrate pad (metal pad) diameter. In this case, upon melting, the solder will pull the photonic device towards the sidewall of the groove in the substrate, effectively aligning the photonic device within the groove. On the other hand, if the die pad (anode) dimension exceeds that of the metal pad of the substrate, surface tension will act in the opposite direction, with the die being pushed away from the edge.

Figure 5A:
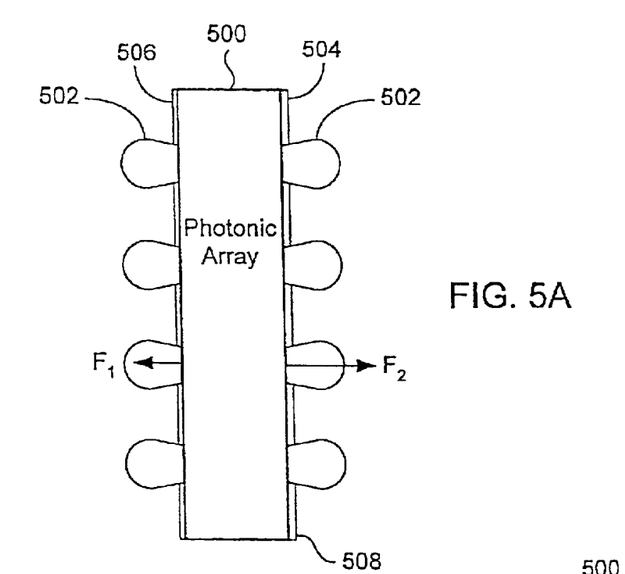
FIG. 5A illustrates the top view with four solder connections both in front (active facets side) and back of the array (common cathode).
Figure 5B:
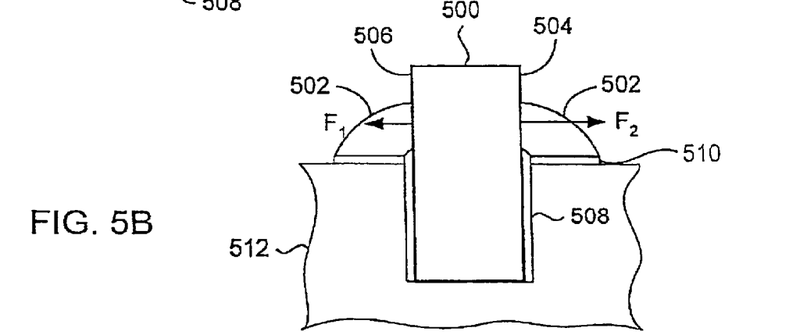
FIG. 5B shows a side view of the array lying within the half-etched groove, with solder connections to the metal pads of the substrate.
Figure 5C:
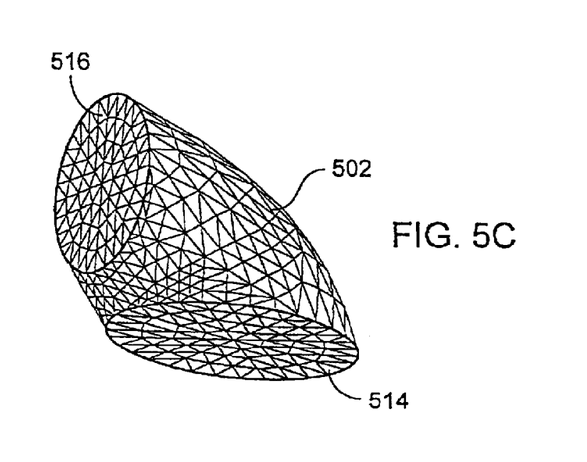
FIG. 5C illustrates an isometric view of one of the joints of FIGS. 5A and 5B.

A number of configurations were simulated with Surface Evolver, a software program used to predict the shape of liquids under surface tension and gravity forces. FIGS. 5A through 5C illustrate the predicted solder joint shapes for a photonic 1×4 array 600 according to one embodiment of the present invention. FIG. 5A illustrates the top view with four solder connections 502 both in front 504 (active facets side) and back 506 of the array 500 (common cathode). FIG. 5B shows a side view of the array 500 lying within the half-etched groove 508, with solder connections to the metal pads 510 of the substrate 512. An isometric view of one of the solder joints 502 is illustrated in FIG. 5C, highlighting the larger metal pad dimension on the substrate side 514 compared to that on the photonic device side 516.

Of interest are the effects of the pad dimensions, the height of the photonic with respect to the groove, and the tolerable gap between the photonic and the sidewall of the groove. The surface tension forces were calculated so to provide an estimate on the self-alignment tendency of the array under different manufacturing design configurations. At an anode or device pad height of 50 μm above the substrate level, a pre-printed solder paste height of 60 μm, and gaps of 10 μm and 15 μm between side wall and die back and front, respectively, the balance of surface tension forces from the solder joints in front and back of the photonic array is 2.6 mg ($F_2-F_1$=17.8–15.2 mg). Such force was more than sufficient to counter the weight of the GaAs photonic device (0.38 mg). The device is predicted to be pulled forward by the front solder joints and rest against the sidewall of the groove 508. $F_2$ and $F_1$, the surface tensions applied through solder balls on the front 504 and back surfaces 506, respectively, of the photonic device 500 are indicated in FIGS. 5A and 5B.

Thirdly, the clearance between die and sidewalls of the groove is important to the implementation of the present invention. The groove needs to be etched slightly larger than the die or die array. The clearance serves two functions, namely, to facilitate pick and place of the component, and to allow for some degree of freedom for self-alignment caused by the solder material.

Figure 6A:
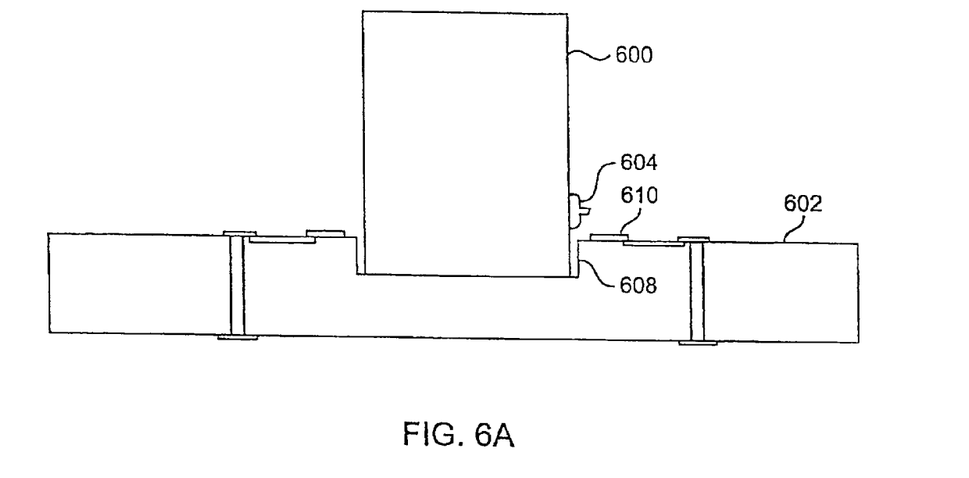
FIG. 6A illustrates a side plan, cross-sectional view of a photonic device having a wirebond stud, wherein the photonic device is placed within a groove of substrate.
Figure 6B:
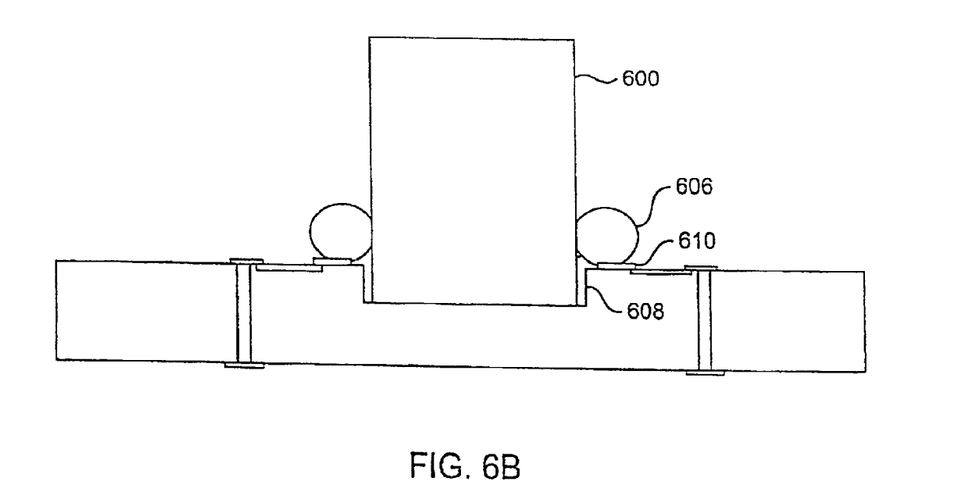
FIG. 6B illustrates a side plan, cross-sectional view of the components of FIG. 6A after conductive epoxy adhesive is applied.

FIGS. 6A and 6B are now referenced to illustrate the method of connecting a photonic device 600 to a substrate 602 through the use of a wirebond stud 604 and conductive epoxy adhesive 606. FIG. 6A illustrates a side plan, cross-sectional view of a photonic device 600 having a wirebond stud 604, wherein the photonic device 600 is placed within a groove 608 of substrate 602. FIG. 6B illustrates a side plan, cross-sectional view of the components of FIG. 6A after conductive epoxy adhesive 606 is applied. The wire bond stud 604 is preferably formed of gold, however, other conductive materials can also be utilized. The wire stud is formed on the bond pad, or anode, of the photonic device. To fit within the manufacturing flow, best results would be obtained when the wirebond studs are formed at the wafer level. With an array of devices, as many wirebond studs are formed as there are pads to handle the anode portion(s) of the photonics.

The depth of the custom-made groove 608 is tailored to the layout of the photonic devices. The critical dimension is the anode pad location so that the wirebond stud can clear the metal pad 610 of the substrate 602 slightly to avoid contact friction. Conductive epoxy 606 can then be dispensed on top of the metal pads 610, and in both front and back of the device 600. The epoxy needs to cover the studs on the front side and similarly make contact with the backside of the die, which is the common cathode. No wirebonding stud is used for the back of the die. Upon heating to cure the epoxy, there will be some degree of self-alignment of the die with respect to the anode pads and the metal pads 610 of the substrate 602. The liquid epoxy will initially drop in viscosity as it is heated. The surface tension will act to reorient the die 600 slightly. Once reaction is initiated, the material viscosity will rise quickly and setting will take place, locking the die into the position where surface tension forces (front and back of die) are balanced.

For both methods of interconnecting the photonic device 600 to the substrate 602, the distance between the optical fibers and the photonic device 600 can be as low as 30 μm. This is possible with the proper design of contact pads to control either the size of the wirebond stud or the solder volume.

Figure 7:
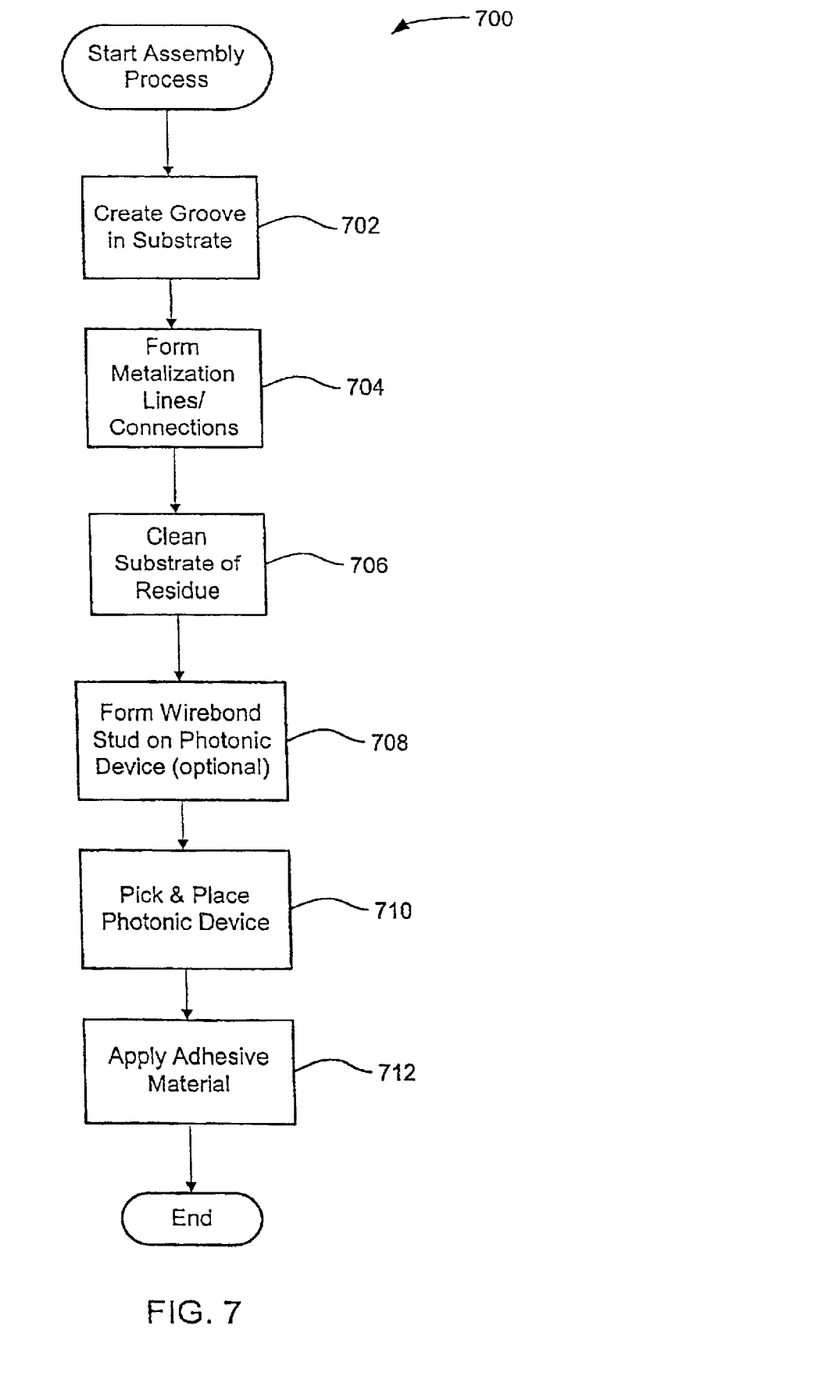
FIG. 7 illustrates a flow diagram that describes the general process for manufacturing the optoelectronic device according to one embodiment of the present invention.

FIG. 7 illustrates a flow diagram 700 that describes the general process for manufacturing the optoelectronic device according to one embodiment of the present invention. The first operation 702 involves creating the groove within the substrate. This can be performed by using an excimer laser, a $CO_2$ laser, or a chemical etching process. Preferably, an excimer laser is used to form the groove. In one implementation, the laser beam spot is about 50 um, and the beam focus was adjusted so that etching could be achieved at constant depth as the laser beam is moved within the programmed pattern. There is typically no discernible curling of the polyimide substrate after laser processing.

In operation 704, metalization lines and metal pads are formed in the substrate. The metalization lines connect the metal pads and vias within the substrate.

In operation 706, to prevent tar and debris from collecting and affecting the performance of the laser beam, a combination of air and/or vacuum can be applied to clear particles during the laser operation. Washing with isopropyl alcohol cleans the grooves and removes potential residues, which may affect the subsequent pick and place of the photonics.

In operation 708 wirebond studs are formed on the photonic devices, preferably in wafer form. This operation is only performed in the case that the interconnection between the photonic devices and the substrate is to be made with the wirebond stud and epoxy adhesive combination.

In operation 710, photonic devices are picked, turned sideways for proper presentation to the grooves, and placed into the grooves of the substrates. In operation 712, adhesive material is applied to the metal pads of the substrates. As mentioned earlier the adhesive material is either solder or conductive epoxy. Of course, the typical curing processes and/or reflow processes are performed to solidify the connection between the photonics and the substrate.

After the photonics have been properly attached to the substrates, the substrates can then be attached to the top surface of chip sub-assemblies so that optoelectronic modules can be formed.

The present invention requires specific assembly tolerances that are within the micron range of accuracy. The following processing steps were identified as critical to the integrity and functionality of the structure. Knowledge of the tolerances involved allows for good design-for-manufacturability for high throughput and yield. One important step is the process of backgrinding the wafers that the photonic devices are made from. Backgrinding polishes the back surface of the devices so that specific device thicknesses can be obtained. With good process control, ±5 µm can be achieved. Another important aspect is the accuracy with which the photonic devices are picked and placed within the groove of the substrates. With the current pick and place equipment (ESEC Micron 2), the pick and place accuracy is ±6 µm. Some custom-made pick and place units, dedicated for O-E packaging, can achieve ±1 µm. This can be achieved by dispensing a die attach prior to pick and place, and snap curing the die attach by either heat or UV to freeze the die in its position. Yet another operation that requires accuracy is the process of forming the metal pads on the substrates. The Non Solder Mask Defined (NSMD) configuration is preferred over the Solder Mask Defined scheme. Plating of metal is more accurate than the printing method used to deposit solder mask on printed circuit boards. For standard board applications, plating can be achieved within ±4.5 µm, while solder mask mis-registration can be as much as 75 µm.

Another operation that requires accuracy is the dicing (cutting) of the wafers. GaAs wafers are more brittle than conventional silicon wafers, and will tend to crack and chip more often. Selection of the proper saw blade (e.g., abrasives bonded in a nickel rather than epoxy matrix) and cutting parameters (speed, feed rate, and cooling) is crucial to ensuring that chipping is minimized. Depending on the machine vision system, accuracy of blade placement is also critical since blade positioning can vary as much as 10 micron within the 50 micron saw street.

Several configurations of the OSA module can be used. The key ones are: 1) Twelve-channel transmitter: Single 1×12 VCSEL array module with 12-fiber connection, without clock or data recovery on the silicon chip; 2) Twelve-channel receiver: Single 1×12 detector array module with 12-fiber connection, without clock or data recovery on the silicon chip; and 3) Configurations combining detector and VCSEL arrays: One configuration can be, for instance, one 1×4 VCSEL array and one 1×4 detector array forming a 4-channel transceiver OSA.

In alternative embodiments of the present invention, a substrate can be formed to have the groove for supporting a transduction device and the contacts for making an electrical connection between the transduction device and a driver module on the same surface of the substrate. In these embodiments, the transduction device and the driver module are positioned on or above the same surface of the substrate.

In an alternative embodiment of the present invention, a hinge can be formed on the housing block into which a pin on the ferrule can be inserted. This hinge configuration allows for the ferrule to swing about the housing block in a similar manner to a door in a doorframe. The purpose of this configuration is to allow the optical fiber(s) to be brought into and out of optical communication with the photonic device through this swinging action. Location of the hinge, which determines the axis about which the ferrule rotates, should be offset from the photonic device. For example, the hinge can be formed at a side or above the photonic device. The hinge can be formed so that the swinging ferrule can be removed when desired, or the swinging ferrule can be permanently attached to the hinge of the housing block.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An optoelectronic module comprising:
a substrate having a top and a bottom surface, a recessed region formed in the top surface of the substrate and including electrical pathways that extend from the perimeter of the recessed region to the bottom surface of the substrate wherein the electrical pathways include metal pads;
a photonic device having active facets and anode pads on a first surface and a cathode surface on an opposing second surface, the anode pads and the cathode surface being in contact with the electrical pathways on the top surface of the substrate, the photonic device being situated within the recessed region of the substrate such that the active facets and anode pads are in a plane that is substantially perpendicular to the top surface of the substrate wherein the metal pads of the substrate are connected with the cathode surface and to each of the anode pads with solder material; and
a chip sub-assembly having an embedded semiconductor die and up-linking contacts that are in electrical communication with the semiconductor die and portions of the electrical pathways on the bottom surface of the substrate.

2. An optoelectronic module as recited in claim 1 wherein the substrate is approximately 50 um thick.

3. An optoelectronic module as recited in claim 1 wherein the surface area of an anode pad is smaller than the surface area of a respective metal pad that is on the top surface of the substrate.

4. An optoelectronic module as recited in claim 1 wherein each of the anode pads is positioned approximately 50 um higher than a respective metal pad.

5. An optoelectronic module as recited in claim 1 wherein the path length from each of the metal pads to the semiconductor die is equal to or less than approximately 300 um.

6. An optoelectronic module as recited in claim 1 further comprising:
a mounting fixture having alignment features extending substantially parallel to the top surface of the chip sub-assembly and configured to connect with and align a ferrule with the photonic device, the ferrule securing one or more optical fibers to be placed in optical communication with the photonic device.

7. An optoelectronic module as recited in claim 1 further comprising:
   at least one optical fiber to be placed in optical communication with the photonic device such that the optical fiber extends in a parallel orientation with a top surface of the chip sub-assembly.

8. An optoelectronic module as recited in claim 1 further comprising:
   a plurality of solder ball material formations that connect the electrical pathways on the bottom surface of the substrate to the up-linking contacts of the chip sub-assembly.

9. An optoelectronic module as recited in claim 1 wherein each of the anode pads and the cathode surface of the photonic device are positioned directly adjacent to a respective metal pad that is on the top surface of the substrate.

10. An optoelectronic module comprising:
   a substrate having a top and a bottom surface, a recessed region formed in the top surface of the substrate and including electrical pathways that extend from the perimeter of the recessed region to the bottom surface of the substrate and include metal pads;
   a photonic device having active facets and anode pads on a first surface and a cathode surface on an opposing second surface, the anode pads and the cathode surface being in contact with the electrical pathways on the top surface of the substrate, the photonic device being situated within the recessed region of the substrate such that the active facets and anode pads are in a plane that is substantially perpendicular to the top surface of the substrate;
   a chip sub-assembly having an embedded semiconductor die and up-linking contacts that are in electrical communication with the semiconductor die and portions of the electrical pathways on the bottom surface of the substrate; and
   wherein a wirebond stud is formed on each of the anode pads of the photonic device and the wirebond studs are connected to the metal pads of the substrate with conductive epoxy.

11. An optical sub-assembly comprising:
   a substrate having a top and a bottom surface and a recessed region formed in the top surface, a plurality of conductive pads positioned about the perimeter of the recessed region, a plurality of conductive vias that extend from the top surface to the bottom surface of the substrate, and a plurality of electrical traces embedded within the top surface of the substrate and connecting respective pairs of conductive pads and vias;
   a photonic device having active facets and anode pads on a first surface and a cathode surface on an opposing second surface, the anode pads and the cathode surface being in contact with the conductive pads of the substrate, the photonic device being situated within the recessed region of the substrate such that the active facets and anode pads are in a plane that is substantially perpendicular to the top surface of the substrate; and
   the sub-assembly is configured so that the conductive pads of the substrate are connected with the cathode surface and each of the anode pads using one of a solder material or a conductive epoxy without the need for a wire connection.

12. An optical sub-assembly as recited in claim 11 wherein the conductive pads of the substrate are connected to the cathode surface and each of the anode pads through solder material.

13. An optical sub-assembly as recited in claim 12 wherein each of the anode pads and the cathode surface of the photonic device are positioned directly adjacent to a respective conductive pad that is on the top surface of the substrate.

14. An optical sub-assembly as recited in claim 11 wherein a wirebond stud is formed on each of the anode pads of the photonic device and the wirebond studs are connected to the conductive pads of the substrate with conductive epoxy.

15. An optical sub-assembly as recited in claim 11 wherein the substrate is approximately 50 um thick.

16. An optical sub-assembly as recited in claim 11 wherein the surface area of an anode pad is smaller than the surface area of a respective conductive pad.

17. An optical sub-assembly as recited in claim 11 wherein each of the anode pads is positioned approximately 50 um higher than a respective conductive pad.

18. An optical sub-assembly as recited in claim 11 wherein the optical sub-assembly is attached to a driver module.

19. An optical sub-assembly as recited in claim 18 wherein the driver module is a chip sub-assembly.

* * * * *

UNITED STATES PATENT AND TRADEMARK OFFICE
CERTIFICATE OF CORRECTION

PATENT NO. : 6,973,225 B2
DATED : December 6, 2005
INVENTOR(S) : Nguyen et al.

It is certified that error appears in the above-identified patent and that said Letters Patent is hereby corrected as shown below:

Column 6,
Lines 42-43, change "CSA 105" to -- CSA 106 --.

Signed and Sealed this

Sixth Day of June, 2006

JON W. DUDAS
*Director of the United States Patent and Trademark Office*